US006818384B2

(12) United States Patent
Choi et al.

(10) Patent No.: US 6,818,384 B2
(45) Date of Patent: Nov. 16, 2004

(54) METHODS OF FABRICATING MICROELECTRONIC FEATURES BY FORMING INTERMIXED LAYERS OF WATER-SOLUBLE RESINS AND RESIST MATERIALS

(75) Inventors: Sangjun Choi, Seoul (KR); Sihyeung Lee, Kyonggi-do (KR); Hyoungdo Kim, Seoul (KR); Woosung Han, Seoul (KR)

(73) Assignee: Samsung Electronics Co., Ltd. (KR)

( * ) Notice: Subject to any disclaimer, the term of this patent is extended or adjusted under 35 U.S.C. 154(b) by 44 days.

(21) Appl. No.: 10/266,219

(22) Filed: Oct. 8, 2002

(65) Prior Publication Data

US 2004/0086804 A1 May 6, 2004

(51) Int. Cl.[7] ................................................. G03F 7/00
(52) U.S. Cl. ....................... 430/311; 430/156; 430/313; 430/330; 430/322; 430/942
(58) Field of Search ................................. 430/311, 156, 430/313, 330, 322, 942

(56) References Cited

U.S. PATENT DOCUMENTS

| | | | | |
|---|---|---|---|---|
| 4,391,857 A | * | 7/1983 | Saito et al. | 427/385.5 |
| 6,177,181 B1 | * | 1/2001 | Hamada et al. | 428/304.4 |
| 6,319,853 B1 | | 11/2001 | Ishibashi et al. | 438/780 |
| 6,579,657 B1 | * | 6/2003 | Ishibashi et al. | 430/270.1 |

FOREIGN PATENT DOCUMENTS

EP        001152036 A1 * 11/2001

OTHER PUBLICATIONS

Kanada et al., "Advanced Microlithography Process with Chemical Shrink Technology," Advances in Resist Technology and Processing XVII, Proceedings of SPIE, vol. 3999, 2000, pp. 881–889.

Kudo, et al., "CD Changes of 193 nm Resists During SEM Measurement," Advances in Resist Technology and Processing XVII, Proceedings of SPIE, vol. 3999, 2000, pp. 179–189.

* cited by examiner

*Primary Examiner*—John A. McPherson
*Assistant Examiner*—Deborah Chacko-Davis
(74) *Attorney, Agent, or Firm*—Myers Bigel Sibley & Sajovec

(57) ABSTRACT

A resist pattern can be formed on a microelectronic substrate, the resist pattern comprising a resist material. A coating layer, including a water-soluble resin, is formed on the resist pattern, wherein the water-soluble resin and the resist material are miscible with one another and intermix to provide an intermixed layer comprising the resist material and the water-soluble resin between the resist pattern and a non-intermixed coating layer. The intermixed layer can be hardened and the non-intermixed coating layer can be removed from the hardened intermixed layer.

32 Claims, 3 Drawing Sheets

METHODS OF FABRICATING MICROELECTRONIC FEATURES BY FORMING INTERMIXED LAYERS OF WATER-SOLUBLE RESINS AND RESIST MATERIALS

FIELD OF THE INVENTION

The present invention relates to the field of integrated circuits in general, and more particularly, to methods of forming features of integrated circuits and features so formed.

BACKGROUND

It is known to use light sources, such as lasers, as a part of a photolithographic process of fabricating integrated circuits. For example, it is known to use i-line and KrF excimer lasers to form patterns on integrated circuit substrates which are used to form integrated circuit devices. As the size of integrated circuit features decreases, lasers which produce light having a relatively short wavelength may be used in the photolithographic process to form the features. For example, ArF and F2 excimer lasers may be used to form integrated circuit features that are smaller than those formed using the i-line or KrF excimer lasers discussed above.

It is also known to select photoresist materials (used to form the patterns for the features to be formed) based on the type of laser used during the photolithographic process. For example, photoresist materials, such as poly(meth)acrylate, cyclo-olefin maleic anhydride(COMA) and polynorbornene, may be used in conjunction with ArF and F2 excimer lasers.

Scanning Electron Microscopy (SEM) may be used to measure the size of the features formed by the photolithographic process. For example, SEM may be used to confirm or measure a Critical Dimension (CD) of the features formed by the process. However, one of the problems associated with the use of some photoresist materials, such as those discussed above in association with ArF excimer lasers, is that exposure to the SEM may cause phenomena referred to as line edge roughness (LER) and E-beam shrinkage.

FIG. 1 is a schematic diagram which illustrates E-beam shrinkage wherein the actual width of the feature formed by the photolithographic process is reduced as a result of exposure to the SEM. Moreover, the more that the feature is exposed to the SEM, the more the feature may shrink. For example, FIG. 2 is a graph that illustrates measurements of actual feature sizes measured using SEM. As shown in FIG. 2, as the number of top down SEM measurements is increased, the critical dimension of features formed using ArF can decrease in a range of 6% to 15% compared to the initial measurement of the feature using SEM.

E-beam curing has been proposed as a potential solution to the E-beam shrinkage problem discussed above. In particular, it is known to expose the features to an electron beam using a Focus Exposure Matrix (FEM) which is applied in doses to increase a crosslinking affect in the resist material used during the photolithographic process so that the resist material can be hardened before decomposition of the resist material can occur. Unfortunately, use of this E-beam technology may be expensive and increase the complexity of the process used to fabricate the integrated circuits.

FIG. 3 is a schematic diagram that illustrates the phenomenon referred to as LER. LER can occur due to inadequate homogeneity in the polymerization of the ArF resist material. The inadequate homogeneity can cause the resist material to harden so that the boundary between the hardened and unhardened resist material is rough or uneven. When the unhardened resist material is removed, the rough or uneven boundary between the hardened unhardened resist material causes the edges of the feature to be rough as shown in FIG. 3.

E-beam shrinkage and LER are further discussed in U.S. Pat. No. 6,319,853 to Ishibashi et al. entitled Method of Manufacturing a Semiconductor Device Using a Minute Resist Pattern, and a Semiconductor Device Manufactured Thereby ("Ishibashi").

SUMMARY

Embodiments according to the present invention can provide microelectronic features using water-soluble coatings on resist materials. Pursuant to these embodiments, a resist pattern, of a resist material, can be formed on a microelectronic substrate. A coating layer, including a water-soluble resin, is formed on the resist pattern, wherein the water-soluble resin and the resist material are miscible with one another and intermix to provide an intermixed layer comprising the resist material and the water-soluble resin between the resist pattern and a non-intermixed coating layer. The intermixed layer can be hardened and the non-intermixed coating layer can be removed from the hardened intermixed layer.

The hardened intermixed layer can reduce E-beam shrinkage and LER by protecting the underlying resist material, such as an ArF resist, an F2 (157 nm) resist, an Extreme Ultra Violet resist, or an X-ray resist, from the effects of E-beam radiation. The hardened intermixed layer can increase the width of the feature defined by the resist material by an amount equal to the hardened intermixed layer's thickness. When the resist material and the hardened intermixed layer are exposed to the E-beam radiation, the shrinkage caused by the E-beam can be reduced compared to that of conventional systems.

In some embodiments according to the present invention, the coating layer includes a solution of the water-soluble resin having a concentration in a range between about 5% and about 10% by weight and at least one or more of a solution of a water-soluble crosslinking agent having a concentration in a range between about 1% and about 20% by weight or de-ionized water. In some embodiments according to the present invention, the coating layer is devoid of a crosslinking agent. In some embodiments according to the present invention, the coating layer is devoid of de-ionized water.

In some embodiments according to the present invention, the non-intermixed coating layer is removed from the hardened intermixed layer by rinsing the non-intermixed coating layer from the hardened intermixed layer using an aqueous medium that is devoid of a water-soluble organic solvent, such as isopropyl alcohol (IPA). In some embodiments according to the present invention, the non-intermixed coating layer is rinsed from the hardened intermixed layer "using an aqueous medium consisting essentially of de-ionized water."

In some embodiments according to the present invention, because of the water-solubility of the coating layer, the non-intermixed portion of the coating layer can be rinsed from the structure using, for example, only water and can avoid the use of water-soluble organic solvents (such as IPA) which solvents are used in some conventional approaches.

In some embodiments according to the present invention, the water-soluble resin is a pyrrolidone-based polymer such as an acrylic acid-based polymer, an alkyl amine-based polymer, an ammonium salt-based polymer, a maleic acid-based polymer, or a polyaromatic polymer.

In some embodiments according to the present invention, the pyrrolidone-based polymer includes at least one of a polyvinylpyrrolidone(PVP), a poly(1-vinylpyrrolidone-co-acrylic acid) or a poly(1-vinylpyrrolidone-co-2-dimethylaminoethyl methacrylate).

In some embodiments according to the present invention, the acrylic acid-based polymer includes at least one of a poly acrylic acid, a poly(acrylamide-co-acrylic acid) or a poly (acrylonitrile-co-acrylic acid).

In some embodiments according to the present invention, the alkyl amine-based polymer includes at least one of a poly(allylamine), a poly(dimethylamine-co-epichlorohydrin-co-ethylenediamine) or a polyethylenimine.

In some embodiments according to the present invention, the ammonium salt-based polymer includes at least one of a poly(acrylamide-co-diallyldimethylammonium chloride), a poly(diallyldimethylammonium chloride) or a poly (vinylbenzyl chloride) ammonium salt.

In some embodiments according to the present invention, the maleic acid-based polymer is poly(methyl vinyl ether-alt-maleic acid).

In some embodiments according to the present invention, the polyaromatic polymer includes at least one of a poly (styrene-co-maleic acid), a poly(styrenecarboxylic acid), a poly(styrenesulfonic acid) or a poly(hydroxystyrene-co-2-hydroxyethyl methacrylate).

DETAILED DESCRIPTION OF EMBODIMENTS ACCORDING TO THE INVENTION

Figure 1:
FIG. 1 is a schematic illustration of E-beam shrinkage of features measured using SEM according to conventional systems.
Figure 2:
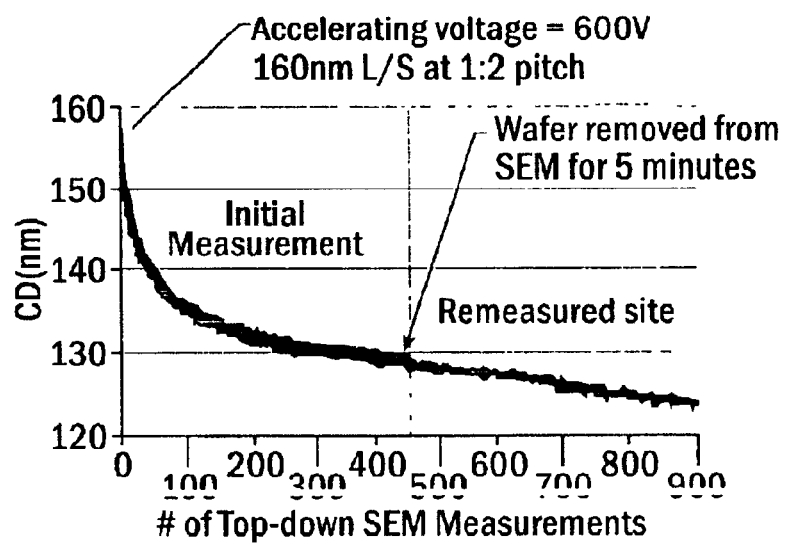
FIG. 2 is a graph that illustrates amounts of E-beam shrinkage of features measured using SEM according to conventional systems.
Figure 3:
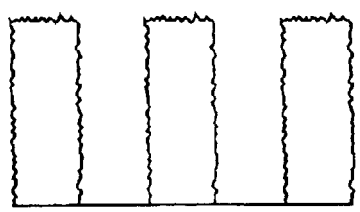
FIG. 3 is a schematic illustration of LER of features measured using SEM according to conventional systems.

The present invention now will be described more fully hereinafter with reference to the accompanying figures, in which embodiments of the invention are shown. This invention should not be construed as limited to the embodiments set forth herein. Accordingly, specific embodiments thereof are shown by way of example in the drawings and will herein be described in detail. It should be understood, however, that there is no intent to limit the invention to the particular forms disclosed. Like numbers refer to like elements throughout the description of the figures. In the figures, the dimensions of layers and regions may be exaggerated for clarity. It will also be understood that when an element, such as a layer, region or substrate, is referred to as being "on" another element, it can be directly on the other element or intervening elements may also be present. In contrast, when an element, such as a layer, region or substrate, is referred to as being "directly on" another element, there are no intervening elements present.

As used herein, the term "intermixed" refers to materials or layers having at least two constituent elements. For example, when the material or layer is described as an intermixed layer that includes a water-soluble resin and a resist material, it will be understood that the materials which make up the water-soluble resin and the resist material appear throughout the intermixed layer. It will be further understood that the constituent elements may be distributed uniformily throughout the intermixed layer. It will be further understood that the constituent elements may be in different proportions to one another in different portions of the intermixed layer.

Figure 4A:
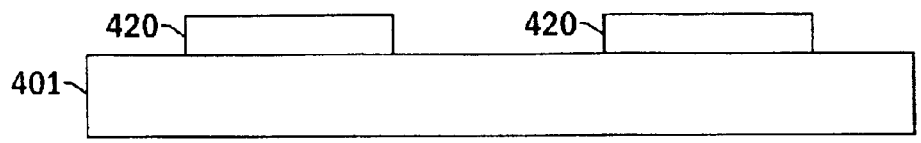
FIGS. 4A–4F are block diagrams that illustrate methods and structures according to the present invention.

FIGS. 4A–4F illustrate embodiments of microelectronic features formed according to the present invention. As shown in FIG. 4A, a resist pattern 420 is formed on a microelectronic substrate 401. In some embodiments according to the present invention, the resist pattern 420 can be an ArF resist material. In other embodiments according to the present invention, the resist pattern 420 can be an F2 (157 nm) resist, an Extreme Ultra Violet resist, an X-ray resist, or the like.

Figure 4B:
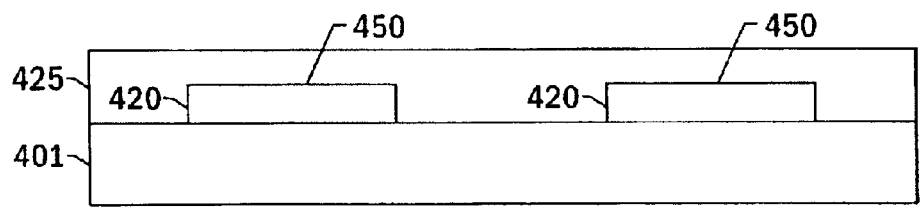

In FIG. 4B, a second resist or coating layer 425 is formed on the resist pattern 420 and on the microelectronic substrate 401. The coating layer 425 can be a water-soluble resin which is miscible with the resist material so that the water-soluble resin and the resist material are able to intermix with one another. A boundary 450 represent the boundary between the coating layer 425 and the resist pattern 420.

Figure 4C:
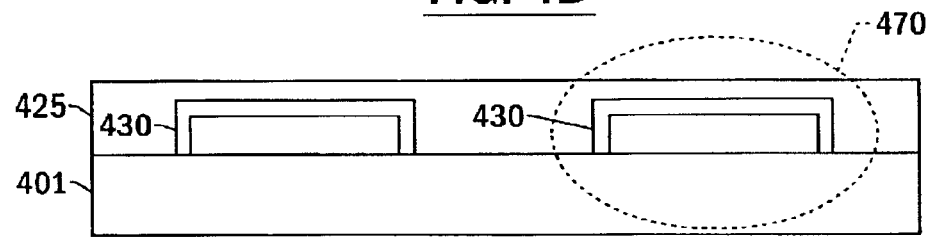

According to FIG. 4C, the structure shown is heated to a temperature in a range between about 80° C. and about 150° C. The heating can cause portions of the resist pattern 420 to intermix with adjacent portions of the coating layer 425 to form an intermixed layer 430, which includes the resist material and the water soluble resin, between the resist pattern 420 and a non-intermixed portion of the coating layer 425. The heating can be what is sometimes referred to as a "Mixing and Baking treatment" (MB) which, in some embodiments according to the present invention, can include heating the structure to a temperature of about 110 degrees centigrade for 60 seconds. It will be understood that, in other embodiments according to the present invention, different temperatures and times may be used.

The heating can also promote, via a crosslinking agent, a crosslinking reaction between materials included in the coating layer 425 and the resist pattern 420 which can cause the intermixed layer 430 to harden thereby preventing the resist pattern 420 under the intermixed layer 430 from being removed by a subsequent rinsing step (or reducing an amount of the resist pattern 420 removed by the rinsing).

Figure 4D:
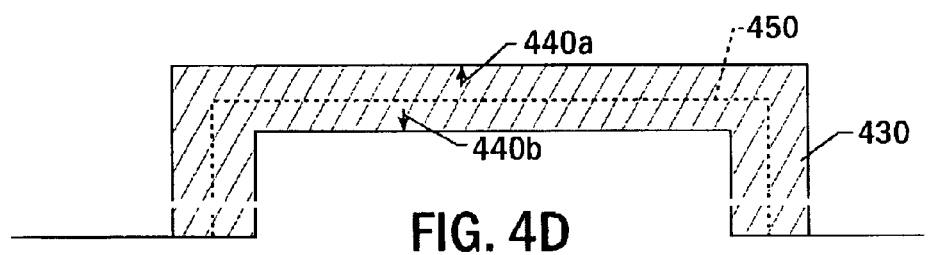

FIG. 4D illustrates an enlarged view of the structure highlighted in FIG. 4C by region 470 as shown in FIG. 4D, the hardened intermixed layer 430 extends outside and inside the original boundary 450 between the coating layer 425 and the resist pattern 420 prior to heating as illustrated by arrows 440a and 440b. In some embodiments according to the present invention, the thickness of the hardened intermixed layer is in a range between about 5 nm and about 20 nm. The hardened intermixed layer 430 is an intermixture of the material in the coating layer 425 and the material in the resist pattern 420. The non-intermixed portion of the coating layer 425 remains outside the hardened intermixed layer 430 on the microelectronic substrate 401.

Figure 4E:
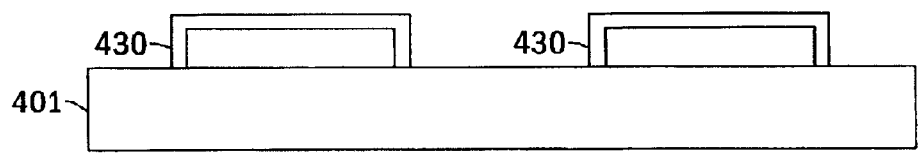

According to FIG. 4E, the non-intermixed portion of the coating layer 425 is removed from the microelectronic substrate 401 and the hardened intermixed layer 430 by rinsing the structure with an aqueous medium that is devoid of a water-soluble organic solvent, such as isopropyl alcohol (IPA). In some embodiments according to the present invention, the aqueous medium used to rinse the structure consists essentially of de-ionized water (DI). In some embodiments according to the present invention, the non-intermixed coating layer is rinsed with an alkaline TMAH solution before being rinsed with the aqueous medium described above so as to reduce a "footing" phenomenon at the base of the sidewalls of the hardened intermixed layer 430. It will be understood that in some embodiments according to the present invention, the non-intermixed coating layer can be rinsed with an alkaline solution other than a TMAH solution.

Figure 4F:
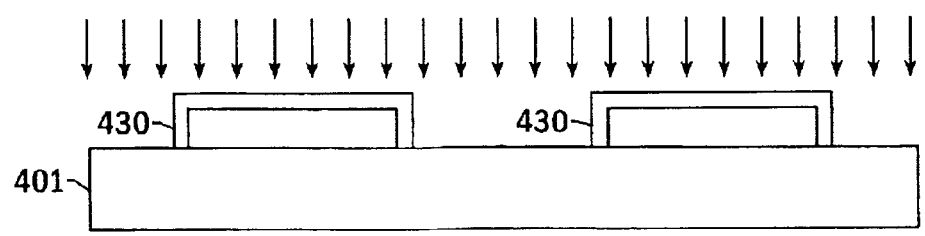

As shown in FIG. 4F, the structure can be measured using SEM techniques know to those having skill in art to measure the CD of the features formed as described above. According to the present invention, the hardened intermixed layer 430 can reduce E-beam shrinkage and LER by protecting the underlying resist material from the effects of E-beams discussed above. The hardened intermixed layer can increase the width of the feature defined by the material by an amount equal to the hardened intermixed layer's thickness. When the resist material and the hardened intermixed layer are exposed to the E-beam radiation, the shrinkage caused by the E-beam radiation can be reduced compared to that of conventional systems.

Furthermore, because of the water-solubility of the coating layer, the non-intermixed portion of the coating layer 425 can be rinsed from the structure using, for example, consisting essentially of water and can avoid the use of water-soluble organic solvents (such as IPA) such as is done in some conventional approaches.

The coating layer 425 discussed above will now be described in further detail. The coating layer comprises a water-soluble resin. In some embodiments according to the present invention, the coating layer comprises a solution of a water-soluble resin having a concentration in a range between a lower limit of about 5, 6, 7, 8, or 9% and an upper limit of about 6, 7, 8, 9, or 10%. In some embodiments according to the present invention, the molecular weight of the water-soluble resin is in a range between a lower limit of about 10,000, 50,000, 100,000, 200,000, 300,000, 400,000, or 500,000 and an upper limit of about 500,000, 600,000, 700,000, 800,000, 900,000, or 1,000,000. In some embodiments according to the present invention, the water-soluble resin has a concentration in proportion to the molecular weight of the water-soluble resin. In some embodiments according to the present invention. the coating layer 425 includes additional ingredients such as surfactants.

The water-soluble resin may be various water soluble resins that are miscible with the selected resist material so that the water-soluble resin and the resist material are able to intermix with one another as will be understood by those skilled in the art including, but not limited to, pyrrolidone-base polymer resins, acrylic acid-base polymer resins, alkyl amine-base polymer resins, ammonium salt-based polymer resins, maleic acid-based polymer resins, polyaromatic polymer resins, and mixtures thereof.

In some embodiments according to the present invention, the water soluble resin can be a pyrrolidone-based polymer such as polyvinylpyrrolidone(PVP), a poly(1-vinylpyrrolidone-co-acrylic acid) or a poly(1-vinylpyrrolidone-co-2-dimethylaminoethyl methacrylate). It will also be understood that the water-soluble resin can be any combination of these alternatives.

In some embodiments according to the present invention, the water-soluble resin can be an acrylic acid-based polymer such as poly acrylic acid, a poly(acrylamide-co-acrylic acid) or a poly(acrylonitrile-co-acrylic acid). It will also be understood that the water-soluble resin can be any combination of these alternatives.

In some embodiments according to the present invention, the water soluble resin can be an alkyl amine-based polymer such as a poly(allylamine), a poly(dimethylamine-co-epichlorohydrin-co-ethylenediamine) or a polyethylenimine. It will also be understood that the water-soluble resin can be any combination of these alternatives.

In some embodiments according to the present invention, the water-soluble resin can be an ammonium salt-based polymer such as a poly(acrylamide-co-diallyldimethylammonium chloride), a poly(diallyldimethylammonium chloride) or a poly(vinylbenzyl chloride) ammonium salt. It will be understood that the water-soluble resin can be any combination of these alternatives.

In some embodiments according to the present invention, the water-soluble resin can be a maleic acid-based polymer such as maleic acid-based polymer comprises poly(methyl vinyl ether-alt-maleic acid. It will be understood that the water-soluble resin can be any combination of these alternatives.

In some embodiments according to the present invention, the water-soluble resin can be a polyaromatic polymer such as polyaromatic polymer comprises at least one of a poly(styrene-co-maleic acid), a poly(styrenecarboxylic acid), a poly(styrenesulfonic acid) or a poly(hydroxystyrene-co-2-hydroxyethyl methacrylate). It will be understood that the polymer can be any combination of these alternatives.

In some embodiments according to the present invention, the coating layer comprises a water-soluble resin as described above, and further comprises a crosslinking agent. In some embodiments according to the present invention, the crosslinking agent has a concentration in a range between a lower limit of about 1, 2, 3, 4, 5, 6, 7, 8, 9, 10, 11, 12, 13, 14, 15, 16, 17, 18, or 19% and an upper limit of about 2, 3, 4, 5, 6, 7, 8, 9, 10, 11, 12, 13, 14, 15, 16, 17, 18, 19, or 20%. The crosslinking agent may be various water-soluble crosslinking agents capable of crosslinking the material in the coating layer with the water-soluble resin as will be understood by those skilled in the art. In some embodiments according to the present invention, the water-soluble crosslinking agent can be a multi-glycidyl ammonium compound such as triglycidyl isocyanurate, diclycidylamino ethanol, or mixtures thereof. In contrast to conventional methods, such as those discussed in U.S. Pat. No. 6,319,853 to Ishibashi et al., the crosslinking agent according to embodiments of the present invention is water-soluble such that the crosslinking agent may be rinsed from the substrate without using a water-soluble organic solvent, such as isopropyl alcohol (IPA). In some embodiments of the present invention, the coating layer is devoid of a crosslinking agent.

In some embodiments according to the present invention, the coating layer comprises a water-soluble resin as described above and further comprises de-ionized water. In other embodiments, the coating layer is devoid of de-ionized water.

In some embodiments according to the present invention, the coating layer comprises a water-soluble resin as described above, a crosslinking agent as described above, and de-ionized water.

The resist material in the resist pattern 420 can be various resist materials that are miscible with the water-soluble resin in the coating layer as will be understood by those skilled in the art. Whether a selected resist material is miscible with a selected water-soluble resin can be readily determined using methods understood by those skilled in the art. In some embodiments, the resist material is ArF.

Embodiments of the present invention will now be described with reference to the following examples. It should be appreciated that these examples are for the purposes of illustrating aspects of the present invention, and do not limit the scope of the invention as defined by the claims.

EXAMPLES

Embodiments according to the present invention will now be described with reference to the following examples. It should be appreciated that these examples are for the purposes of illustrating aspects of the present invention, and do not limit the scope of the invention as defined by the claims.

Example 1

A first resist material of ArF (available from Shipley Co.,Ltd.) was deposited on a silicon wafer, and the silicon wafer was spin-coated with the resist. The wafer was subjected to a pre-soaking treatment at 120 degrees centigrade for 90 seconds to evaporate a solvent from the resist, thus forming a first resist pattern to a thickness of about 3,000 angstroms. The first resist pattern was exposed to ArF excimer laser light using an ArF reduced exposure system through a mask. The substrate was then subjected to a Post Exposure Bake (PEB) treatment at 120 degrees centigrade for 90 seconds. Subsequently, the substrate was developed through use of a 2.83 wt. % alkaline TMAH solution (available from Tokyo Oyokagaku Kogyo Ltd.), producing a resist pattern.

Example 2

A mixed solution comprising water-soluble resin and a water-soluble crosslinking agent was formed as material for the second resist (or coating layer) by mixing polyvinylpyrrolidone (e.g., 5 g, Mw=55,000, hereinafter abbreviated to PVP), triglycidyl isocyanurate (0.5 g), and 100 cc of pure water and by agitating the thus-prepared mixture for 12 hours at room temperature and then by filtering it using a 0.2 $\mu$m membrane filter. A small portion of surfactant may be added to the solution.

Example 3

A mixed solution comprising water-soluble resin and a water-soluble crosslinking agent was formed as material for the second resist (or coating layer) by mixing poly (diallyldimethylammonium chloride) (e.g., 5 g), diglycidylamino ethanol (0.5 g), and 100 cc of pure water and by agitating the thus-prepared mixture for 12 hours at room temperature and then by filtering it using a 0.2 $\mu$m membrane filter. A small portion of surfactant may be added to the solution.

Example 4

A mixed solution comprising water-soluble resin and a water-soluble crosslinking agent was formed as material for the second resist (coating layer) by mixing poly (hydroxystyrene-co-2-hydroxyethyl methacrylate) (e.g., 5 g), and 100 cc of pure water and by agitating the thus-prepared mixture for 12 hours at room temperature and then by filtering it using a 0.2 $\mu$m membrane filter. A small portion of surfactant may be added to the solution.

Example 5

A mixed solution comprising water-soluble resin and a water-soluble crosslinking agent was formed as material for the second resist (coating layer) by mixing poly(styrene-co-maleic acid) (e.g., 5 g), triglycidyl isocyanurate (0.5 g), and 100 cc of pure water and by agitating the thus-prepared mixture for 12 hours at room temperature and then by filtering it using 0.2 $\mu$m membrane filter. A small portion of surfactant may be added to the solution.

Example 6

The material for the second resist prepared as described in Example 2 was dropped on a silicon wafer having the first resist patterns formed thereon as described in Example 1. The silicon wafer was spin-coated with the second resist. Subsequently, the wafer was subjected to a mixing-and-baking (MB) treatment at 110 degrees centigrade for 60 seconds, thereby accelerating an intermixing reaction and a crosslinking reaction. A non-intermixed layer was dissolved and removed from the wafer by the steps of: rinsing the wafer with water for 60 seconds and drying the wafer while it was being spun. The wafer was then subjected to a post development baking treatment at 110 degrees centigrade, thus forming an intermixed layer over the first resist pattern having a width that was increased by 20 nm (i.e., the width of the first resist was increased from 110 nm to 130 nm) by the intermixed layer. The intermixed layer over the first resist pattern was exposed to CD-SEM according to the following parameters: 800 eV, 6.0 pA and 8 frames. It was observed that the width of the intermixed layer over the first resist pattern was reduced by 8 nm by the E-beam (i.e., from 130 nm to 122 nm).

Example 7

The material for the second resist prepared as described in Example 3 was deposited on a silicon wafer having the first resist pattern formed thereon as described in Example 1. The silicon wafer was then spin-coated with the second resist. Subsequently, the wafer was subjected to a mixing-and-baking (MB) treatment at 110 degrees centigrade for 60 seconds, thereby accelerating an intermixing reaction and a crosslinking reaction. A non-intermixed layer was dissolved and removed from the wafer by the steps of: rinsing the wafer with water for 60 seconds and drying the wafer while it was being spun. The wafer was then subjected to a post development baking treatment at 110 degrees centigrade, thus forming an intermixed layer over the first resist pattern having a width that was increased by 10 nm (i.e., the width of the first resist was increased from 110 nm to 120 nm) by the intermixed layer. The first resist pattern was exposed to CD-SEM according to the following parameters: 800 eV, 6.0 pA and 8 frames. It was observed that the width of the intermixed layer over the first resist pattern was reduced by 7 nm by the E-beam (i.e., from 120 nm to 113 nm).

Example 8

The material for the second resist prepared as described in Example 4 was deposited on a silicon wafer having the first resist patterns formed thereon in Example 1. The silicon wager was then spin-coated with the second resist. Subsequently, the wafer was subject to a mixing-and-baking (MB) treatment at 110 degrees centigrade for 60 seconds, thereby accelerating an intermixing reaction and a crosslinking reaction. A non-intermixed layer was dissolved and removed from the wafer by the steps of: rinsing the wafer with water for 60 seconds and drying the wafer while it was being spun. The wafer was then subjected to a post development baking treatment at 110 degrees centigrade, thus forming an intermixed layer over the first resist pattern having a width that was increased by 14 nm (i.e., the width of the first resist was increased from 110 nm to 124 nm) by the intermixed layer. The first resist pattern was exposed to CD-SEM according to the following parameters: 800 eV, 6.0 pA and 8 frames. It was observed that the width of the intermixed layer over the first resist pattern was reduced by 8 nm by the E-beam (i.e., from 124 nm to 116 nm).

Example 9

The material for the second resist prepared as described in Example 5 was deposited on a silicon wafer having the first resist pattern formed thereon as discussed in Example 1. The silicon wafer was then spin-coated with the second resist. Subsequently, the wafer was subjected to a mixing-and-baking (MB) treatment at 110 degrees centigrade for 60 seconds, thereby accelerating an intermixing reaction and a crosslinking reaction. A non-intermixed layer was dissolved and removed from the wafer by the steps of rinsing the wafer with water for 60 seconds and drying the wafer while it was being spun. The wafer was then subjected to a post development baking treatment at 110 degrees centigrade, thus forming an intermixed layer over the first resist pattern having a width that was increased by 18 nm (i.e., the width of the first resist was increased from 110 nm to 128 nm) by the intermixed layer. The first resist pattern was exposed to CD-SEM according to the following parameters: 800 ev, 6.0 pA and 8 frames. It was observed that the width of the intermixed layer over the first resist pattern was reduced by 6 nm by the E-beam (i.e., from 128 nm to 122 nm).

Example 10

The material for the second resist prepared, as described in Examples 2 to 5, was deposited on a silicon wafer having the first resist pattern formed thereon as described in Example 1. The silicon wafer was then spin-coated with the second resist. Subsequently, the wafer was subjected to a mixing-and-baking (MB) treatment at 110 degrees centigrade for 60 seconds, thereby accelerating an intermixing reaction and a crosslinking reaction. A non-intermixed layer was dissolved and removed from the wafer by the steps of: cleansing the wafer with an alkaline TMAH solution (2.38 wt. %) for 10 seconds; rinsing the wafer with water for 60 seconds; and drying the wafer while it was being spun. The wafer was then subjected to a post development baking treatment at 110 degrees centigrade, thus forming an intermixed layer over the first resist pattern.

Figure 5:
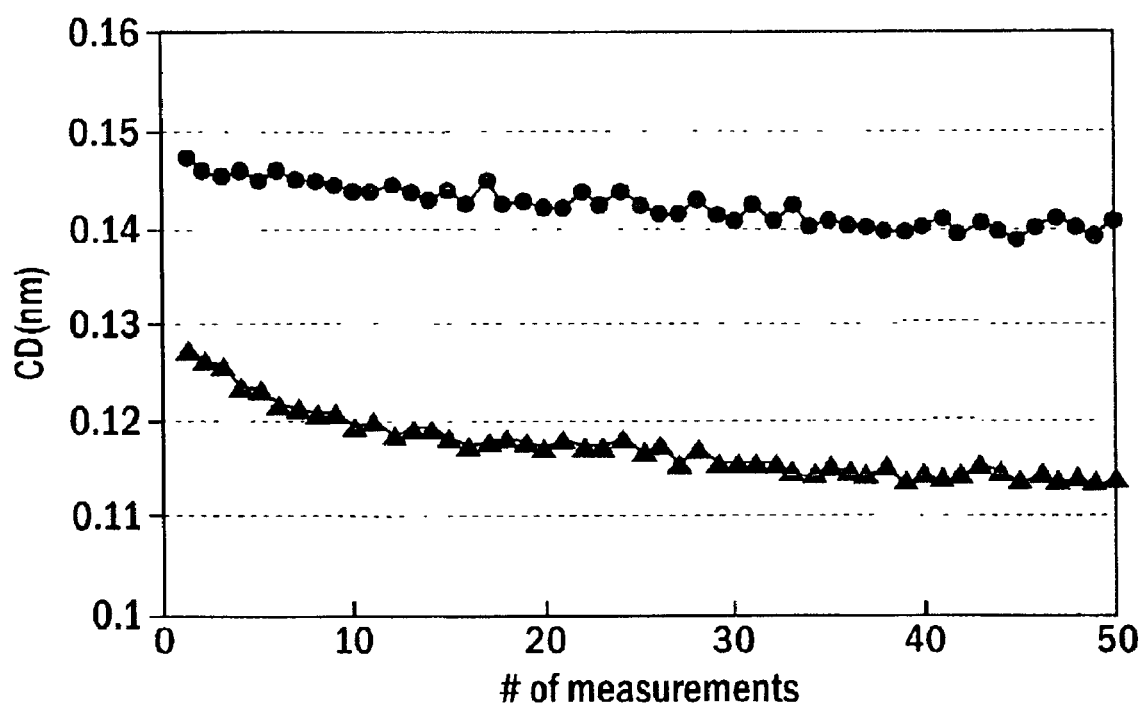
FIG. 5 is a graph that illustrates exemplary results using embodiments according to the present invention compared to conventional approaches.

FIG. 5 is a graph that illustrates exemplary results using embodiments according to the present invention compared to conventional approaches. In particular, FIG. 5 illustrates that in embodiments according to the present invention (illustrated using the ●), the shrinkage of the CD of the features formed is less than that seen in conventional systems (illustrated using the ▲).

As discussed above, in embodiments according to the present invention, a hardened intermixed layer can reduce E-beam shrinkage and LER by protecting an underlying ArF resist material from the effects of E-beam radiation. The hardened intermixed layer can increase the width of the feature defined by the ArF material by an amount equal to the hardened intermixed layer's thickness. When the ArF resist material and the hardened intermixed layer are exposed to the E-beam radiation, the shrinkage caused by the E-beam can be reduced compared to that of conventional systems. Furthermore, because of the water-solubility of the coating layer, the non-intermixed portion of the coating layer can be rinsed from the structure using, for example, only water and can avoid the use of water-soluble organic solvents (such as IPA), which are used in some conventional approaches.

In the drawings and specification, there have been disclosed embodiments of the invention and, although specific terms are employed, they are used in a generic and descriptive sense only and not for purposes of limitation, the scope of the invention being set forth in the following claims.

What is claimed:

1. A method of forming a microelectronic feature on a microelectronic substrate, the method comprising:
    forming a resist pattern on a microelectronic substrate, the resist pattern comprising a resist material;
    forming a coating layer comprising a water-soluble resin on the resist pattern, wherein the water-soluble resin and the resist material arc miscible with one another and intermix to provide an intermixed layer comprising the resist material and the water-soluble resin between the resist pattern and a non-intermixed coating layer;
    hardening the intermixed layer; and
    removing the non-intermixed coating layer from the hardened intermixed layer.

2. A method according to claim 1 further comprising:
    exposing the hardened intermixed layer to E-beam radiation.

3. A method according to claim 1 wherein removing the non-intermixed coating layer from the hardened intermixed layer comprises rinsing the non-intermixed coating layer from the hardened intermixed layer using an aqueous medium that is devoid of a water-soluble organic solvent.

4. A method according to claim 1 wherein removing the non-intermixed coating layer from the hardened intermixed layer comprises rinsing the non-intermixed coating layer from the hardened intermixed layer using an aqueous medium consisting essentially of de-ionized water.

5. A method according to claim 1 wherein a molecular weight of the water-soluble resin is in a range between about 10,000 and 1,000,000.

6. A method according to claim 1 wherein the coating layer is devoid of a crosslinking agent.

7. A method according to claim 1 wherein the intermixed layer comprises a mixture of the water-soluble resin and the resist material.

8. A method according to claim 1 wherein the hardened intermixed layer has a thickness in a range between about 5 nm and 20 nm.

9. A method according to claim 1 wherein the resist material comprises at least one of an ArF resist, an F2 (157 nm) resist, an Extreme Ultra Violet resist, and an X-ray resist.

10. A method according to claim 1 wherein the coating layer comprises a solution of the water-soluble resin having a concentration in a range between about 5% to 10% by weight, a solution of a water-soluble crosslinking agent having a concentration in a range between about 1% to 20% by weight, and de-ionized water.

11. A method according to claim 1 wherein the water-soluble resin comprises a pyrrolidone-based polymer.

12. A method according to claim 1 wherein the water-soluble resin is selected from the group consisting of a pyrrolidone-based polymer, an acrylic acid-based polymer, an alkyl amine-based polymer, an ammonium salt-based polymer, a maleic acid-based polymer, and a polyaromatic polymer, and mixtures thereof.

13. A method according to claim 12 wherein the pyrrolidone-based polymer is selected from the group consisting of a polyvinylpyrrolidone(PVP), a poly(1-vinylpyrrolidone-co-acrylic acid), a poly(1-vinylpyrrolidone-co-2-dimethylaminoethyl methacrylate), and mixtures thereof.

14. A method according to claim 12 wherein the acrylic acid-based polymer is selected from the group consisting of a poly acrylic acid, a poly(acrylamide-co-acrylic acid), a poly(acrylonitrile-co-acrylic acid), and mixtures thereof.

15. A method according to claim 12 wherein the alkyl amine-based polymer is selected from the group consisting of a poly(allylamine), a poly(dimethylamine-co-epichlorohydrin-co-ethylenediamine), a polyethylenimine, and mixtures thereof.

16. A method according to claim 12 wherein the ammonium salt-based polymer is selected from the group consisting of a poly(acrylamide-co-diallyldimethylammonium chloride), a poly(diallyldimethylammonium chloride), a poly(vinylbenzyl chloride) ammonium salt, and mixtures thereof.

17. A method according to claim 12 wherein the maleic acid-based polymer comprises poly(methyl vinyl ether-alt-maleic acid).

18. A method according to claim 12 wherein the polyaromatic polymer comprises at least one of a poly(styrene-co-maleic acid), a poly(styrenecarboxylic acid), a poly(styrenesulfonic acid) or a poly(hydroxystyrene-co-2-hydroxyethyl methacrylate).

19. A method according to claim 1 wherein the coating layer further comprises a water-soluble crosslinking agent.

20. A method according to claim 19 wherein the water-soluble crosslinking agent comprises at least one or more of an epoxy crosslinking agent or a salt type crosslinking agent.

21. A method according to claim 20 wherein the epoxy crosslinking agent comprises a multi glycidyl ammonium compound.

22. A method according to claim 21 wherein the multi glycidyl ammonium compound comprises at least one of triglycidyl isocyanurate or diglycidylamino ethanol.

23. A method according to claim 19 wherein the water-soluble crosslinking agent is present in a concentration having a range between about 1% and about 20% by weight.

24. A method according to claim 1 wherein the water-soluble resin has a concentration that is in proportion to a molecular weight of the water-soluble resin.

25. A method according to claim 1 wherein the concentration of the water-soluble resin in the coating layer is in a range between about 5% and about 15% by weight.

26. A method according to claim 1 wherein removing the non-intermixed coating layer is preceded by rinsing the non-intermixed coating layer with an alkaline TMAH solution.

27. A method according to claim 1 wherein a thickness of the hardened intermixed layer is directly proportioned to the miscibility of resist material and the water-soluble resin.

28. A method according to claim 1 wherein the hardening of the intermixed layer comprises heating the water-soluble resin and the coating layer to form the intermixed layer.

29. A method according to claim 28 wherein the heating of the water-soluble resin and the coating layer comprises heating the water-soluble resin and the coating layer to a temperature in a range between about 80° C. and about 150° C.

30. A method according to claim 1 wherein the intermixed layer is formed by transforming a portion of the water-soluble resin and a portion of the resist material adjacent to the portion of the water-soluble resin.

31. A method according to claim 1 wherein the microelectronic substrate comprises a semiconductor substrate.

32. A method according to claim 1 wherein the coating layer is devoid of de-ionized water.

* * * * *